United States Patent
Huang et al.

(10) Patent No.: US 7,454,739 B2
(45) Date of Patent: Nov. 18, 2008

(54) METHOD AND APPARATUS FOR DETERMINING AN ACCURATE PHOTOLITHOGRAPHY PROCESS MODEL

(75) Inventors: Jensheng Huang, San Jose, CA (US);
Chun-Chieh Kuo, Hsinchu (TW);
Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 189 days.

(21) Appl. No.: 11/443,715

(22) Filed: May 31, 2006

(65) Prior Publication Data

US 2007/0283312 A1    Dec. 6, 2007

(51) Int. Cl.
*G06F 17/50* (2006.01)

(52) U.S. Cl. .............. 716/20; 716/19; 716/21; 430/5; 430/30

(58) Field of Classification Search ............. 716/19–21; 430/5, 30
See application file for complete search history.

(56) References Cited

U.S. PATENT DOCUMENTS

| | | | |
|---|---|---|---|
| 6,871,337 B2 * | 3/2005 | Socha .................. | 716/19 |
| 6,880,135 B2 * | 4/2005 | Chang et al. ........... | 716/4 |

| | | | |
|---|---|---|---|
| 2002/0161527 A1 | 10/2002 | Inui | |

FOREIGN PATENT DOCUMENTS

| | | | |
|---|---|---|---|
| EP | 1 688 795 A2 | 8/2006 | |
| EP | 1 696 269 A2 | 8/2006 | |
| GB | 2 320 768 A | 7/1998 | |

OTHER PUBLICATIONS

Chang-Nam Ahn, "A Novel Approximate Model for Resist Process," SPIE vol. 3334, pp. 752-763, 1998.

* cited by examiner

*Primary Examiner*—Jack Chiang
*Assistant Examiner*—Nghia M Doan
(74) *Attorney, Agent, or Firm*—Park, Vaughan & Fleming LLP

(57) ABSTRACT

One embodiment of the present invention provides a system that determines an accurate process model. During operation, the system receives process data. Next, the system receives an optical model which models an optical system of a photolithography process. The system then determines a stack model using the optical model, wherein the stack model models the effects of the photolithography process on the stack layers. Finally, the system determines a process model using the optical model, the stack model, and the process data.

16 Claims, 3 Drawing Sheets

METHOD AND APPARATUS FOR DETERMINING AN ACCURATE PHOTOLITHOGRAPHY PROCESS MODEL

FIELD OF THE INVENTION

The present invention relates to semiconductor design and manufacturing. More specifically, the present invention relates to a method and an apparatus for determining an accurate process model.

BACKGROUND

Related Art

Rapid advances in computing technology have made it possible to perform trillions of computational operations each second on data sets that are sometimes as large as trillions of bytes. These advances can be attributed to the dramatic improvements in semiconductor manufacturing technologies which have made it possible to integrate tens of millions of devices onto a single chip.

Semiconductor manufacturing technologies typically include a number of processes which involve complex physical and chemical interactions. Since it is almost impossible to find exact formulae to predict the behavior of these complex interactions, researchers typically use process models which are fit to empirical data to predict the behavior of these processes. A process model can be used in a number of applications during the design of a semiconductor chip. For example, process models are commonly used for making corrections to layouts to compensate for undesirable effects of semiconductor manufacturing processes.

A process model can be based on a physical model and/or a black box model. A physical model is usually derived from the underlying physical process. For example, a photolithography process model can use the Hopkins model which uses the principles of optics to model the behavior of an optical system. However, we may not be able to use a physical model to capture all the effects of a semiconductor manufacturing process. To model such effects, prior art techniques typically use a black box model in addition to the physical models. A black box model usually comprises statistical functions that are fit to empirical data. For example, a photolithography process model can comprise a physical model which is based on the Hopkins model and a black box model which is used to model resist behavior.

Unfortunately, there are a number of drawbacks in using black-box statistical functions in a process model. First, statistical functions usually require a large amount of empirical data to converge. Second, statistical models are not as accurate as physical models. Specifically, a statistical model is fit to empirical data which is obtained using a test layout. However, this does not guarantee that the model will work accurately with other layouts. Third, the empirical data is usually obtained for a certain process point (i.e., under certain process conditions). Hence, a black box model that is fit to empirical data for a particular process point may not work accurately under different process conditions, e.g., under defocus or a different exposure energy.

As semiconductor integration densities continue to increase at an exponential rate, the accuracy of process models is becoming increasingly important. Unfortunately, prior art techniques for generating photolithography process models result in process models that are not accurate enough at today's semiconductor densities. Specifically, inaccuracies in the process model negatively affect the efficacy of downstream applications. For example, inaccuracies in the photolithography process model can reduce the efficacy of optical proximity correction (OPC).

Hence, what is needed is a method and an apparatus for determining an accurate process model.

SUMMARY

As semiconductor integration densities continue to increase at an exponential rate, the accuracy of process models is becoming increasingly important.

One embodiment of the present invention provides techniques for determining accurate photolithography process models. Specifically, an embodiment uses an optical model to determine a stack model, which is then fit to empirical data. This is in contrast to prior art techniques which typically determine the optical model and the stack model more or less independently of one another.

In particular, in one embodiment, the optical model is represented using the expression $$\sum_i C_i Z_i,$$

where $Z_i$ is the $i^{th}$ Zernike polynomial and $C_i$ is the $i^{th}$ optical coefficient which is associated with $Z_i$. The stack model, which is determined using the optical model, is represented using the expression $\Sigma C'_i Z_i$, where $C'_i$ is the $i^{th}$ stack coefficient and $Z_i$ is the $i^{th}$ Zernike polynomial. Note that the set of Zernike polynomials used in the stack model is a subset of the set of Zernike polynomials used in the optical model. The process model can then be determined using the optical model, the stack model, and process data.

DETAILED DESCRIPTION

Integrated Circuit Design Flow

Figure 1:
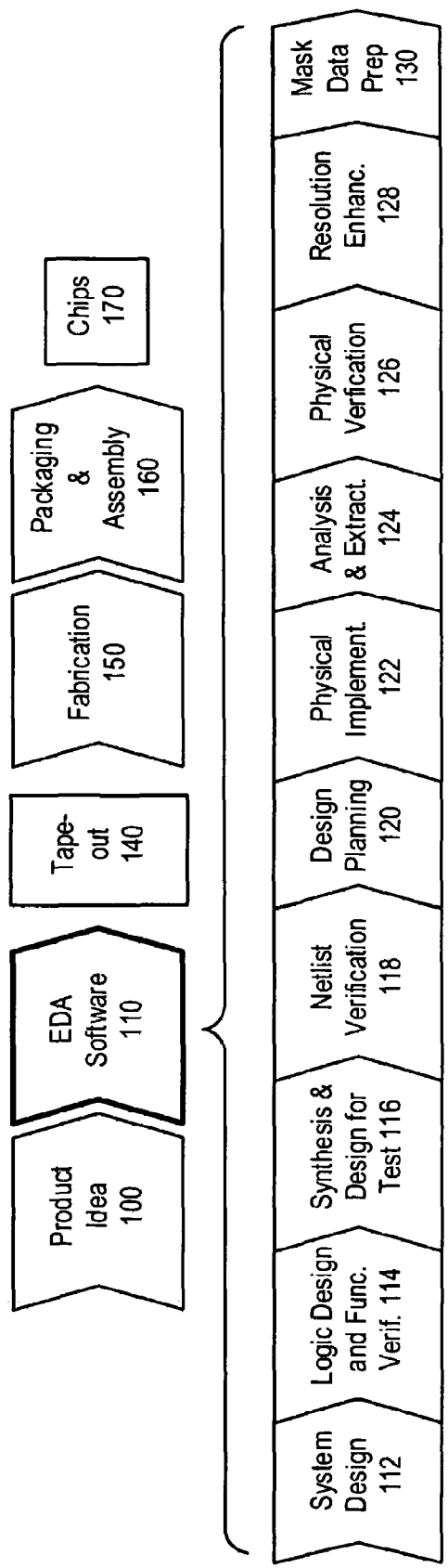
FIG. 1 illustrates various steps in the design and fabrication of an integrated circuit in accordance with an embodiment of the present invention.

FIG. 1 illustrates various steps in the design and fabrication of an integrated circuit in accordance with an embodiment of the present invention.

The process starts with the product idea (step 100) which is realized using an EDA software design process (step 110). When the design is finalized, it can be taped-out (event 140). After tape out, the fabrication process (step 150) and packaging and assembly processes (step 160) are performed which ultimately result in finished chips (result 170).

The EDA software design process (step 110), in turn, comprises steps 112-130, which are described below. The following design flow description is for illustration purposes only. This description is not meant to limit the present invention. For example, an actual integrated circuit design may require the designer to perform the design steps in a different sequence than the sequence described below.

System design (step 112): The designers describe the functionality that they want to implement. They can also perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, tests can be designed and implemented to check the finished chips. Exemplary EDA software products from Synopsys, Inc. that can be used at this step include Design Compiler®, Physical Compiler, Test Compiler, Power Compiler, FPGA Compiler, Tetramax, and DesignWare® products.

Netlist verification (step 118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 120): Here, an overall floorplan for the chip is constructed and analyzed for timing and top-level routing. Exemplary EDA software products from Synopsys, Inc. that can be used at this step include Astro and IC Compiler products.

Physical implementation (step 122): Placement and routing occurs at this step. Exemplary EDA software products from Synopsys, Inc. that can be used at this step include the Astro and IC Compiler products.

Analysis and extraction (step 124): At this step, the circuit function is verified at a transistor level, which also permits what-if refinement. Exemplary EDA software products from Synopsys, Inc. that can be used at this step include AstroRail, PrimeRail, Primetime, and Star RC/XT products.

Physical verification (step 126): In this step, the design is checked to ensure correctness for manufacturing, electrical issues, lithographic issues, and circuitry. Exemplary EDA software products from Synopsys, Inc. that can be used at this step include the Hercules product.

Resolution enhancement (step 128): This step involves geometric manipulations of the layout to improve manufacturability of the design. Exemplary EDA software products from Synopsys, Inc. that can be used at this step include Proteus, ProteusAF, and PSMGen products.

Mask data preparation (step 130): This step provides the "tape-out" data for production of masks to produce finished chips. Exemplary EDA software products from Synopsys, Inc. that can be used at this step include the CATS(R) family of products.

Embodiments of the present invention can be used during one or more of the above described steps. Specifically, one embodiment of the present invention can be used during the resolution enhancement step 128.

Process Models

A process model models the behavior of one or more semiconductor manufacturing processes which typically involve complex physical and chemical interactions. A process model is usually determined by fitting or calibrating a process model to empirical data which is obtained using a test layout. Once a process model is determined, it can be used for a number of purposes during the design of a semiconductor chip. Process models can be determined using black box modeling and/or physical modeling.

Figure 2:
FIG. 2 illustrates a process model which uses black box modeling in accordance with an embodiment of the present invention.

FIG. 2 illustrates a process model which uses black box modeling in accordance with an embodiment of the present invention.

Black box model 204 can use design layout 202 to predict the features on the wafer 206. A black box model typically comprises a number of functions with coefficients and/or parameters which are fit to empirical data. The functions used by a black box model are usually not based on the workings of the underlying physical processes. Instead, these functions are typically general purpose modeling functions which can be used for modeling completely unrelated physical processes.

Figure 3:
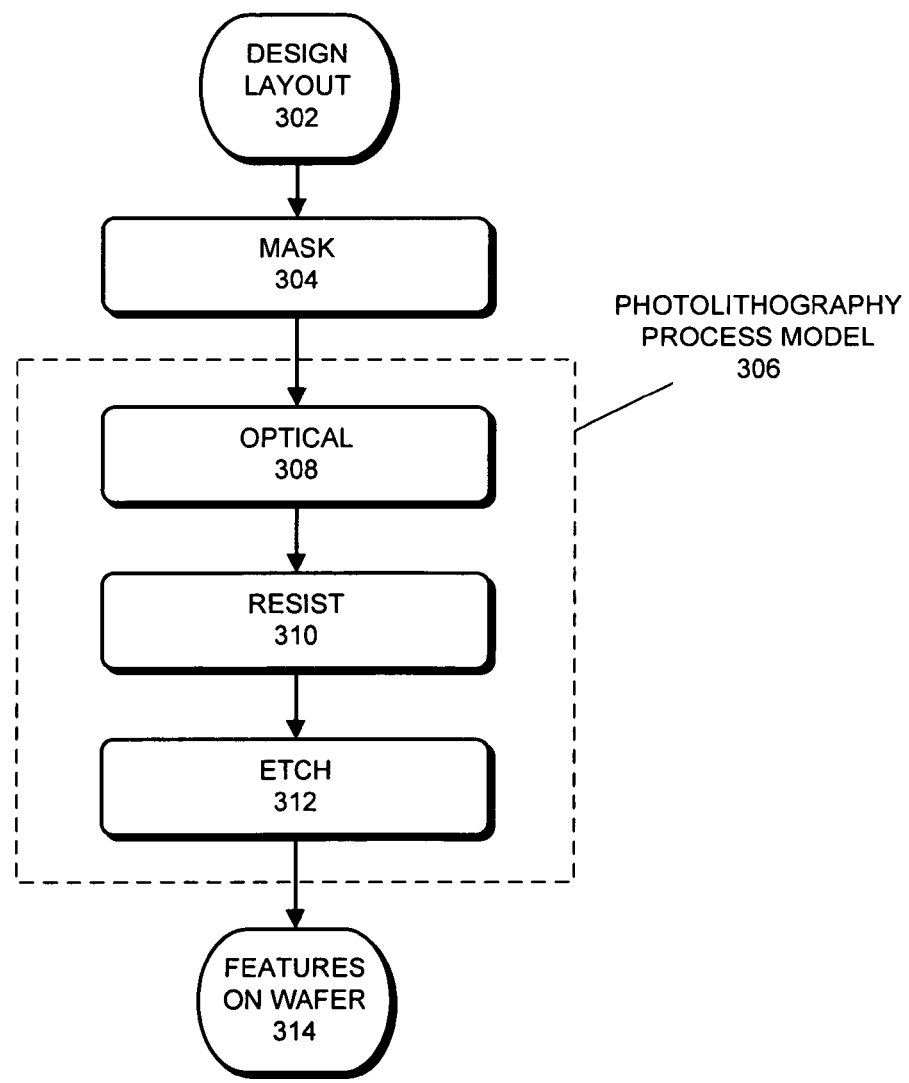
FIG. 3 illustrates a process model which uses physical modeling in accordance with an embodiment of the present invention.

FIG. 3 illustrates a process model which uses physical modeling in accordance with an embodiment of the present invention.

In contrast to black box modeling, physical modeling tries to model the underlying physical processes. For example, a physical model for a photolithography process will typically use the principles of optics to determine the physical model.

The process model shown in FIG. 3 comprises a number of components. Specifically, mask writer model 304 can receive design layout 302 and generate a mask layout. The mask layout can then be received by photolithography process model 306 to predict the features on the wafer 314. The photolithography process model 306, in turn, can comprise a number of physical models and/or black box models which model the various steps of the photolithography process. In particular, photolithography process model 306 can comprise optical system model 308, resist model 310, and etch model 312. Optical system model 308 can model the optical system which is used to expose the resist. Resist model 310 can model the behavior of the resist when it is exposed to radiation. Etch model 312 can model the behavior of the resist when it is etched.

Regardless of whether the process model uses black box models and/or physical models, a process model typically comprises expressions that have parameters which need to be statistically fit to empirical data. Let's consider an example of how a process model can be fit to empirical data. Let the process model contain a function $f(x; \lambda_1, \lambda_2, \ldots, \lambda_n)$, where x is a variable (note that x can be vector) and $\lambda_1, \lambda_2, \ldots, \lambda_n$ are n unknown parameters that are used in the function and which need to be fit to empirical data. Further, let the empirical data contain m values, $y_1=f(x_1), y_2=f(x_2), \ldots, y_m=f(x_m)$. Note that each empirical data-point imposes a constraint on the parameters of the process model, namely, that the process model must return value $y_i$ when it is given input $x_i$. Ideally, we want to determine the parameter values $\lambda_1, \lambda_2, \ldots, \lambda_n$ which will perfectly match the empirical data, i.e., the parameter values will result in a function that will exactly satisfy the constraints $y_1=f(x_1), y_2=f(x_2), \ldots, y_m=f(x_m)$. However, in many situations, an exact fit is not possible. Hence, fitting the process model to the empirical data typically involves using statistical fitting techniques to determine the parameter values $\lambda_1, \lambda_2, \ldots, \lambda_n$ which will result in the minimum error between the empirical data values and the data values generated by the process model. In one embodiment, the system can use a non-linear least-squares fitting technique to determine the parameter values.

Empirical Data

The empirical data is usually generated by applying the semiconductor manufacturing processes that are being modeled to a test layout. For example, an optical lithography process can be used to print a test layout on a wafer. Next, the empirical data can be obtained by measuring the critical dimensions (CD) of features on the resulting wafer before and/or after the etch process. The process model can then be fit to the empirical data to determine a process model that models the optical lithography process and the etch process.

Photolithography Process Model

The optical model in a photolithography process model is usually based on the Hopkins model which uses the principles of optics to model the behavior of partially coherent optical systems.

Figure 4:
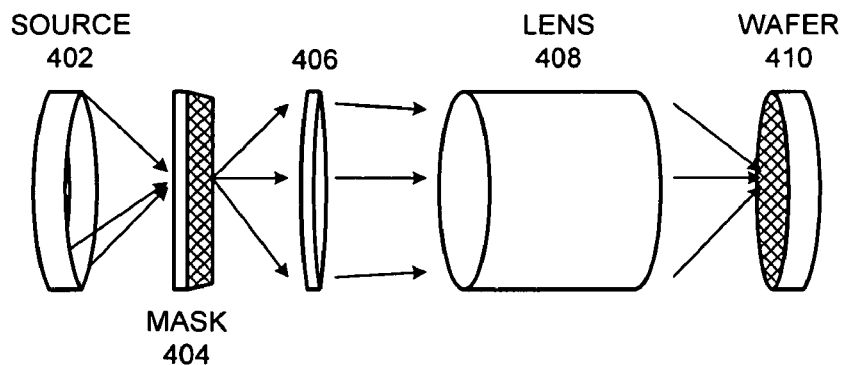
FIG. 4 illustrates a typical optical system in accordance with an embodiment of the present invention.

FIG. 4 illustrates a typical optical system in accordance with an embodiment of the present invention.

Radiation from source 402 passes through mask 404, lens aperture 406, lens body 408, and images on wafer 410. The Hopkins model uses the principles of optics to model these optical system components.

Specifically, the Hopkins model can be described using the expression:

$$I(x, y) = \int\int\int\int J(x', y'; x'', y'') \otimes L(x, y; x', y') \otimes L^*(x, y; x'', y'') dx'dy' dx''dy'',$$

where, $I(x, y)$ is the optical intensity at point $(x, y)$ on the wafer, $L(x, y; x', y')$ is a lumped model of the light source and the mask, $L^*$ is the complex conjugate of $L$, and $J(x', y'; x'', y'')$ models the incoherence between two points of light on the mask. The lumped model (L) essentially treats the mask as an array of light sources. In particular, $L(x, y; x', y')$ models point $(x', y')$ on the mask as a point source, and $J(x', y'; x'', y'')$ models the incoherence between the light emanating from points $(x', y')$ and $(x'', y'')$ on the mask. The lumped model (L) can be represented as a convolution between the mask and the source. For example, the lumped model can be represented using a mask model and a source model as follows:

$$L(x, y; x', y') = M(x', y') \oplus K(x, y; x', y'),$$

where $M(x', y')$ models the mask and $K(x, y; x', y')$ models the source.

The Hopkins model can be used to determine a 4-D (four dimensional) matrix called the Transmission Cross Coefficient (TCC) matrix which models the optical system. The TCC matrix can then be represented using a set of orthogonal 2-D (two dimensional) kernels. Specifically, the set of orthogonal kernels can be determined using the eigenfunctions of the TCC matrix. The features on the wafer can be determined by convolving the set of 2-D kernels with the mask. General information on photolithography and process modeling can be found in Alfred Kwok-Kit Wong, *Optical Imaging in Projection Microlithography*, SPIE-International Society for Optical Engine, 2005, and Grant R. Fowles, *Introduction to Modern Optics*, 2$^{nd}$ Edition, Dover Publications, 1989.

In one embodiment, the system uses Zernike polynomials, which are a set of orthogonal functions, to represent the optical system. Zernike polynomials are made up of terms that are of the same form as the types of aberrations often observed in optical systems. For example, one Zernike polynomial may be associated with defocus, while another may be associated with tilt, etc. Zernike polynomials are usually represented in polar coordinates.

Specifically, the optical system can be represented using the expression $$\sum_i C_i Z_i,$$

where $Z_i$ is the $i^{th}$ Zernike polynomial and $C_i$ is the $i^{th}$ optical coefficient which is associated with $Z_i$.

Note that the resist can be modeled using a black box model and/or a physical model which models the behavior of the resist when it is exposed to radiation.

Prior art techniques usually do not fit all the components of a process model to empirical data. Instead, prior art techniques first determine the optical coefficients ($C_i$) for the optical model using the parameters of the optical system, such as, the numerical aperture, wavelength, partial coherence factor, etc. Next, prior art techniques use the optical model to fit the resist model and/or the etch model to empirical data. Note that prior art techniques usually do not change the optical coefficients ($C_i$) when they fit the other physical and/or black box models to empirical data.

Since physical models usually do not completely capture the behavior of semiconductor manufacturing processes, prior art techniques typically use statistical functions to capture the effects which are not captured by the physical models.

Specifically, prior art photolithography models can be represented using the expression O+R+E+S, where O is the optical model, R is the resist model, E is the etch model, and S is a statistical component which captures the effects that were not adequately modeled by the physical models.

Unfortunately, photolithography process models generated using prior art techniques are not accurate enough at today's chip densities. Specifically, process model inaccuracies negatively affect the efficacy of downstream applications. Furthermore, since semiconductor integration densities are expected to increase at an exponential rate, the detrimental effects of these inaccuracies are expected to become even more pronounced in the future.

Process for Determining an Accurate Photolithography Process Model

Figure 5:
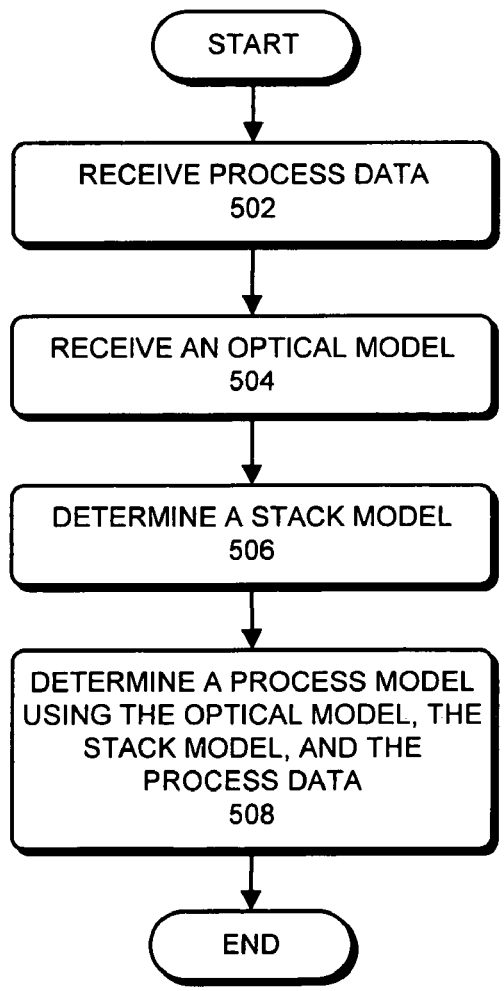
FIG. 5 presents a flowchart that illustrates a process for determining an accurate process model in accordance with an embodiment of the present invention.

FIG. 5 presents a flowchart that illustrates a process for determining an accurate process model in accordance with an embodiment of the present invention.

The process usually begins by receiving process data (step 502).

The process data can be obtained by applying the photolithography process to a layout, and by measuring critical dimensions of the resulting features on the wafer before and/or after the etch step.

Next, the system receives an optical model which models an optical system of a photolithography process (step 504).

The optical model can be based on the Hopkins model which uses the principles of optics to model partially coherent optical systems.

In one embodiment the optical model is represented using a weighted sum of orthogonal functions. Specifically, the optical model can be represented by the expression $$\sum_i C_i Z_i,$$

where $Z_i$ is the $i^{th}$ Zernike polynomial and $C_i$ is the $i^{th}$ optical coefficient which is associated with $Z_i$.

The system then determines a stack model using the optical model (step 506). A stack model can model the effects of the photolithography process on the stack layers (e.g., resist layer, etc.).

One embodiment uses the optical model as the stack model. Specifically, the stack model uses the same orthogonal functions as the optical model, but with different coefficients. The intuition behind using the optical model for modeling the behavior of the stack is as follows: since the optical model is used to describe the behavior of light in the fluid phase medium, the same model can also be used to describe the behavior of light in the stack medium.

Next, the system determines the process model using the optical model, the stack model, and the process data (step 508).

Specifically, the system can determine the process model by fitting the stack model to the process data. Note that some parameters in the stack model may be determined using physical parameters, such as, photoresist thickness, anti-reflective-coating (ARC) thickness, ARC refractive index, ARC diffusion constants, etc. Once the process model is determined, it can be used for a number of downstream applications. Specifically, the process model can be used by an optical proximity correction (OPC) process.

In one embodiment, instead of fitting the stack model to the empirical data, the system fits mapping parameters which map the coefficients of the optical model onto the stack model. Specifically, let $I = I_g + I_s$ be the process model where $$I_g = \sum_i C_i Z_i$$

is the optical model, and $$I_s = \sum_i C'_i Z_i$$

is the stack model. Further, let $\alpha_i$ be the $i^{th}$ mapping parameter which maps coefficient $C'_i$ to coefficient $C_i$. The process model can be expressed using the mapping parameters as follows:

$$I = I_g + I_s = \sum_i C_i Z_i + \sum_i C'_i Z_i = \sum_i C_i Z_i + \sum_i \alpha_i C_i Z_i = \sum_i (1 + \alpha_i) C_i Z_i.$$

In other words, in one embodiment, the system can first determine the optical model coefficients $C_i$, and then determine the $\alpha_i$ values by fitting the combined optical and stack process models to the empirical data. Note that the photolithography process model may be fully determined once the $C_i$ and $\alpha_i$ values are determined. Furthermore, note that the set of Zernike polynomials used in the stack model is a subset of the set of Zernike polynomials used in the optical model.

Note that many modifications and variations of the above process will be readily apparent to practitioners skilled in the art. For example, in one embodiment, the system can first determine the optical model coefficients $C_i$, and then, instead of determining $\alpha_i$ values, the system can directly modify the $C_i$ values by fitting the optical model to the empirical data.

Similarly, in one embodiment, the system can first receive an optical model which models an optical system of a photolithography process, wherein the optical model is represented using the expression $\Sigma C_i Z_i$, where $C_i$ is the $i^{th}$ optical coefficient and $Z_i$ is the $i^{th}$ Zernike polynomial. Next, the system can receive a stack model which models the effects of the photolithography process on the stack layers, wherein the stack model is represented using the expression $\Sigma C'_i Z_i$, where $C'_i$ is the $i^{th}$ stack coefficient and $Z_i$ is the $i^{th}$ Zernike polynomial. The system can then receive process data which is obtained by applying the photolithography process to a layout, and by measuring critical dimensions of the resulting features on the wafer. Finally, the system can determine a process model using the optical model, the stack model, and the process data.

Furthermore, although the present invention is described using Zernike polynomials, the present invention can also be used with other orthogonal functions.

An embodiment of the present invention does not introduce new Zernike polynomials while fitting empirical data. Instead it uses the same Zernike polynomials that are used in the optical model and changes their coefficients to fit the empirical data. This makes the resulting process model more robust and also causes the model to converge faster. In contrast, prior art techniques typically add new functions to the process model in addition to the functions present in the optical model. As a result, prior art process models have more "degrees of freedom" which can cause these models to be inaccurate and which can also cause them to take longer to converge. For example, while fitting the resist and etch models, prior art techniques may add extra Zernike polynomials to the process model beyond those required by the optical model. Similarly, as noted before, prior art process models do not extrapolate well across different process points. Specifically, prior art techniques typically add new Zernike polynomials if they need to extend a process model to different process points. In contrast, an embodiment of the present invention does not add Zernike polynomials beyond those already present in the optical model.

Furthermore, note that the Zernike polynomials that are usually included in the optical model are powerful enough to model stack behavior.

To summarize, physical modeling results in more accurate models than black box modeling because physical models extrapolate better across different layout and process conditions. Furthermore, a physical model typically requires less empirical data to perform regression. One embodiment of the present invention uses a physical model (as opposed to a black box model) to model the stack, thereby improving the accuracy of the resulting process model.

Process models generated using prior art techniques have a number of drawbacks. First, prior art process models require a large amount of empirical data to converge. In contrast, process models generated using embodiments of the present invention usually require substantially less amount of empirical data to converge. Second, prior art process models are not as accurate as process models generated using embodiments of the present invention. Specifically, prior art process models do not extrapolate well across different layouts or process points. In contrast, since an embodiment of the present invention uses the optical model to fit empirical data, the resulting process model is more robust than prior art process models, and it extrapolates well across different layouts and process points.

CONCLUSION

The data structures and code described in the foregoing description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs), or any device capable of storing data usable by a computer system.

Furthermore, the foregoing descriptions of embodiments of the present invention have been presented only for purposes of illustration and description. They are not intended to be exhaustive or to limit the present invention to the forms disclosed. Accordingly, many modifications and variations will be readily apparent to practitioners skilled in the art. The above disclosure is not intended to limit the present invention. The scope of the present invention is defined by the appended claims.

What is claimed is:

1. A method for determining a process model, the method comprising:
    receiving process data which is obtained by:
        subjecting one or more layouts to a photolithography process to create features on one or more wafers, and
        measuring dimensions of the features;
    receiving an optical model which models the photolithography process's optical system, wherein the optical model is a first weighted sum of a set of orthogonal functions;
    determining an uncalibrated stack model for modeling stack layers, wherein the uncalibrated stack model uses a subset of the set of orthogonal functions; based on Zernike polynomials
    determining an uncalibrated process model by combining the optical model and the uncalibrated stack model; and
    determining a calibrated process model by fitting the uncalibrated process model to the process data, wherein the calibrated process model is a second weighted sum of the set of orthogonal functions.

2. The method of claim 1, wherein the optical model is based on the Hopkins model which uses the principles of optics to model partially coherent optical systems.

3. The method of claim 1,
    wherein the set of orthogonal functions are determined using a Transmission Cross Coefficient (TCC) matrix of the optical system.

4. The method of claim 1,
    wherein the optical model is represented by the expression $\Sigma C_i Z_i$, where $C_i$ is the $i^{th}$ optical coefficient and $Z_i$ is the $i^{th}$ Zernike polynomial;
    wherein the stack model uncalibrated is represented by the expression $\Sigma C'_i Z_i$, where $C'_i$ is the $i^{th}$ stack coefficient and $Z_i$ is the $i^{th}$ Zernike polynomial; and
    wherein the set of Zernike polynomials used in the stack model is a subset of the set of Zernike polynomials used in the optical model.

5. The method of claim 1, wherein the process model is used by an optical proximity correction (OPC) process.

6. A computer-readable storage medium storing instructions that when executed by a computer cause the computer to perform a method for determining a process model, the method comprising:
    receiving process data which is obtained by:
        subjecting one or more layouts to a photolithography process to create features on one or more wafers, and
        measuring dimensions of the features;
    receiving an optical model which models the photolithography process's optical system, wherein the optical model is a first weighted sum of a set of orthogonal functions; based on Zernike polynomials
    determining an uncalibrated stack model for modeling stack layers, wherein the uncalibrated stack model uses a subset of the set of orthogonal functions;
    determining an uncalibrated process model by combining the optical model and the uncalibrated stack model; and
    determining a calibrated process model by fitting the uncalibrated process model to the process data, wherein the calibrated process model is a second weighted sum of the set of orthogonal functions.

7. The computer-readable storage medium of claim 6, wherein the optical model is based on the Hopkins model which uses the principles of optics to model partially coherent optical systems.

8. The computer-readable storage medium of claim 6,
    wherein the set of orthogonal functions are determined using a Transmission Cross Coefficient (TCC) matrix of the optical system.

9. The computer-readable storage medium of claim 6,
    wherein the optical model is represented by the expression $\Sigma C_i Z_i$, where $C_i$ is the $i^{th}$ optical coefficient and $Z_i$ is the $i^{th}$ Zernike polynomial;
    wherein the stack model uncalibrated is represented by the expression $\Sigma C'_i Z_i$, where $C'_i$ is the $i^{th}$ stack coefficient and $Z_i$ is the $i^{th}$ Zernike polynomial; and
    wherein the set of Zernike polynomials used in the stack model is a subset of the set of Zernike polynomials used in the optical model.

10. The computer-readable storage medium of claim 6, wherein the process model is used by an optical proximity correction (OPC) process.

11. A method for determining a process model, the method comprising:
    receiving an optical model which models an optical system of a photolithography process, wherein the optical model is represented using the expression $\Sigma C_i Z_i$, where $C_i$ is the $i^{th}$ optical coefficient and $Z_i$, is the $i^{th}$ Zernike polynomial;
    receiving an uncalibrated stack model for modeling stack layers, wherein the uncalibrated stack model is represented using the expression $\Sigma C'_i Z_i$, where $C'_i$ is the $i^{th}$ stack coefficient and $Z_i$ is the $i^{th}$ Zernike polynomial, wherein the set of Zernike polynomials used in the uncalibrated stack model is a subset of the set of Zernike polynomials used in the optical model;
    receiving process data which is obtained by:
        subjecting one or more layouts to a photolithography process to create features on one or more wafers, and
        measuring dimensions of the features;
    determining an uncalibrated process model by combining the optical model and the uncalibrated stack model; and determining a calibrated process model by fitting the uncalibrated process model to the process data.

12. The method of claim 11, wherein the optical model is determined using the Hopkins model which uses the principles of optics to model partially coherent optical systems.

13. The method of claim 11, wherein the process model is used by an optical proximity correction (OPC) process.

14. A computer-readable storage medium storing instructions that when executed by a computer cause the computer to perform a method for determining a process model, the method comprising:

receiving an optical model which models an optical system of a photolithography process, wherein the optical model is represented using the expression $\Sigma C_i Z_i$, where $C_i$ is the $i^{th}$ optical coefficient and $Z_i$ is the $i^{th}$ Zernike polynomial;

receiving an uncalibrated stack model for modeling stack layers, wherein the uncalibrated stack model is represented using the expression $\Sigma C'_i Z_i$, where $C'_i$ is the $i^{th}$ stack coefficient and $Z_i$ is the $i^{th}$ Zernike polynomial, wherein the set of Zernike polynomials used in the uncalibrated stack model is a subset of the set of Zernike polynomials used in the optical model;

receiving process data which is obtained by:
subjecting one or more layouts to a photolithography process to create features on one or more wafers, and measuring dimensions of the features;

determining an uncalibrated process model by combining the optical model and the uncalibrated stack model; and determining a calibrated process model by fitting the uncalibrated process model to the process data.

15. The computer-readable storage medium of claim 14, wherein the optical model is determined using the Hopkins model which uses the principles of optics to model partially coherent optical systems.

16. The computer-readable storage medium of claim 14, wherein the process model is used by an optical proximity correction (OPC) process.

* * * * *

UNITED STATES PATENT AND TRADEMARK OFFICE
CERTIFICATE OF CORRECTION

PATENT NO. : 7,454,739 B2  Page 1 of 1
APPLICATION NO. : 11/443715
DATED : November 18, 2008
INVENTOR(S) : Jensheng Huang et al.

It is certified that error appears in the above-identified patent and that said Letters Patent is hereby corrected as shown below:

In claim 1 (at column 9, line 43), please add the words "based on Zernike polynomials" to the line so that it reads --functions; based on Zernike polynomials--.

In claim 1 (at column 9, line 46), please delete the words "based on" so that the line reads --a subset of the set of orthogonal functions;--.

In claim 1 (at column 9, line 44), please delete the words "Zernike polynomials".

Signed and Sealed this

Seventeenth Day of February, 2009

JOHN DOLL
*Acting Director of the United States Patent and Trademark Office*